(12) United States Patent
Ahmed et al.

(10) Patent No.: US 10,432,148 B2
(45) Date of Patent: Oct. 1, 2019

(54) PHASE SHIFT AND ATTENUATION CIRCUITS FOR USE WITH MULTIPLE-PATH AMPLIFIERS

(71) Applicant: NXP USA, Inc., Austin, TX (US)

(72) Inventors: Abdulrhman M. S. Ahmed, Gilbert, AZ (US); Mario M. Bokatius, Chandler, AZ (US); Paul R. Hart, Phoenix, AZ (US); Joseph Staudinger, Gilbert, AZ (US); Richard E. Sweeney, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/274,016

(22) Filed: Feb. 12, 2019

(65) Prior Publication Data

US 2019/0181805 A1   Jun. 13, 2019

Related U.S. Application Data

(63) Continuation of application No. 16/119,832, filed on Aug. 31, 2018, now Pat. No. 10,211,787, which is a (Continued)

(51) Int. Cl.
 *H03F 1/02* (2006.01)
 *H03F 3/21* (2006.01)
 (Continued)

(52) U.S. Cl.
 CPC ....... *H03F 1/0288* (2013.01); *G06F 13/4282* (2013.01); *G06G 7/10* (2013.01); (Continued)

(58) Field of Classification Search
None
See application file for complete search history.

(56) References Cited

U.S. PATENT DOCUMENTS 4,967,169 A    10/1990   Sun et al.
5,317,288 A *   5/1994   Yung .............. H03H 11/20
                                              327/237
(Continued)

FOREIGN PATENT DOCUMENTS

CN   1109228 A   9/1995
CN   1180246 A   4/1998
(Continued)

OTHER PUBLICATIONS

Notice of Allowance dated Sep. 16, 2015 for U.S. Appl. No. 14/086,520, 5 pages.
(Continued)

*Primary Examiner* — Lincoln D Donovan
*Assistant Examiner* — Khareem E Almo
(74) *Attorney, Agent, or Firm* — Sherry W. Schumm

(57) ABSTRACT

Embodiments of circuits for use with an amplifier that includes multiple amplifier paths include a first circuit and a second circuit in parallel with the first circuit. The first circuit includes a first input coupled to a first power divider output, a first output coupled to a first amplifier path of the multiple amplifier paths, and a first adjustable phase shifter and a first attenuator series coupled between the first input and the first output. The second circuit includes a second input coupled to a second power divider output, a second output coupled to a second amplifier path of the multiple amplifier paths, and a second adjustable phase shifter coupled between the second input and the second output.

20 Claims, 8 Drawing Sheets

Related U.S. Application Data continuation of application No. 15/874,740, filed on Jan. 18, 2018, now Pat. No. 10,069,463, which is a continuation of application No. 15/344,304, filed on Nov. 4, 2016, now Pat. No. 9,876,475, which is a continuation of application No. 15/184,910, filed on Jun. 16, 2016, now Pat. No. 9,490,755, which is a continuation of application No. 14/728,196, filed on Jun. 2, 2015, now Pat. No. 9,374,051, which is a continuation of application No. 14/287,139, filed on May 26, 2014, now Pat. No. 9,219,453, which is a continuation of application No. 13/959,254, filed on Aug. 5, 2013, now Pat. No. 8,736,347, which is a continuation of application No. 13/360,473, filed on Jan. 27, 2012, now Pat. No. 8,514,007.

(51) Int. Cl.
  H03F 3/60       (2006.01)
  H03F 3/68       (2006.01)
  H03F 3/189      (2006.01)
  G06G 7/10       (2006.01)
  H03G 1/00       (2006.01)
  H04L 27/22      (2006.01)
  G06F 13/42      (2006.01)
  H03F 3/19       (2006.01)
  H04L 7/00       (2006.01)

(52) U.S. Cl.
  CPC ............ H03F 3/189 (2013.01); H03F 3/19 (2013.01); H03F 3/211 (2013.01); H03F 3/602 (2013.01); H03F 3/68 (2013.01); H03G 1/0088 (2013.01); H04L 7/0079 (2013.01); H04L 27/22 (2013.01); H03F 2200/387 (2013.01); H03F 2200/438 (2013.01); H03F 2200/451 (2013.01); H03F 2203/21106 (2013.01); H03F 2203/21193 (2013.01); H03G 2201/106 (2013.01)

(56) References Cited

U.S. PATENT DOCUMENTS

| | | | |
|---|---|---|---|
| 5,666,089 A | 9/1997 | Ehlers | |
| 5,912,599 A | 6/1999 | Beall | |
| 5,969,572 A * | 10/1999 | Jeong | H03F 1/3229 330/149 |
| 6,236,286 B1 * | 5/2001 | Hoffmann | H03F 1/3229 330/149 |
| 7,402,821 B2 * | 7/2008 | Bernhardt | H01J 37/248 250/396 R |
| 7,683,828 B2 * | 3/2010 | Stagliano, Jr. | G01S 7/025 342/173 |
| 8,180,303 B2 | 5/2012 | Dupuy et al. | |
| 8,354,882 B2 * | 1/2013 | Blednov | H03F 1/0288 330/124 R |
| 8,514,007 B1 * | 8/2013 | Ahmed | G06G 7/10 327/355 |
| 8,653,890 B1 * | 2/2014 | Ahmed | H03F 1/0222 330/107 |
| 8,736,347 B2 * | 5/2014 | Ahmed | G06G 7/10 327/355 |
| 8,816,767 B2 * | 8/2014 | Ahmed | H03F 1/0222 330/107 |
| 9,419,566 B2 * | 8/2016 | Noori | H03F 1/0288 |
| 9,479,232 B1 * | 10/2016 | Loui | H04B 7/0617 |
| 9,621,387 B1 * | 4/2017 | Magers | H03C 3/40 |
| 9,647,611 B1 * | 5/2017 | Embar | H03F 1/0288 |
| 9,748,903 B2 * | 8/2017 | Staudinger | H03F 1/0288 |
| 9,774,299 B2 * | 9/2017 | Staudinger | H03F 1/0288 |
| 9,825,545 B2 * | 11/2017 | Chen | H02M 3/335 |
| 9,837,966 B1 * | 12/2017 | Ahmed | H03F 1/0288 |
| 9,876,475 B2 * | 1/2018 | Ahmed | G06G 7/10 |
| 9,912,298 B2 * | 3/2018 | Lyalin | H03F 1/0288 |
| 9,912,326 B2 * | 3/2018 | Mandegaran | H03K 5/125 |
| 9,966,903 B1 * | 5/2018 | McLaren | H03F 1/0288 |
| 10,211,785 B2 * | 2/2019 | McLaren | H03F 3/19 |
| 2002/0084845 A1 | 7/2002 | Eisenberg et al. | |
| 2005/0017897 A1 | 1/2005 | Monk | |
| 2007/0030922 A1 * | 2/2007 | Kato | H04L 27/364 375/308 |
| 2007/0164237 A1 * | 7/2007 | Bernhardt | H01J 37/248 250/492.21 |
| 2008/0012756 A1 * | 1/2008 | Stagliano | G01S 7/025 342/26 R |
| 2008/0089145 A1 | 4/2008 | Luthra | |
| 2009/0109732 A1 | 4/2009 | Houston | |
| 2011/0116558 A1 * | 5/2011 | Otaka | H03F 1/34 375/259 |
| 2013/0194023 A1 * | 8/2013 | Ahmed | G06G 7/10 327/360 |
| 2013/0241655 A1 | 9/2013 | Liss et al. | |
| 2013/0241656 A1 * | 9/2013 | Tajima | H03F 3/68 330/295 |
| 2013/0314143 A1 * | 11/2013 | Ahmed | G06G 7/10 327/360 |
| 2014/0077874 A1 * | 3/2014 | Ahmed | H03F 3/211 330/124 R |
| 2014/0125409 A1 * | 5/2014 | Ahmed | H03F 1/0222 330/129 |
| 2014/0253248 A1 * | 9/2014 | Ahmed | G06G 7/10 330/295 |
| 2015/0054582 A1 * | 2/2015 | Goss | H03F 1/3247 330/279 |
| 2015/0097623 A1 * | 4/2015 | Staudinger | H03F 1/0288 330/295 |
| 2015/0116039 A1 * | 4/2015 | Ahmed | H03F 1/0233 330/295 |
| 2017/0070217 A1 * | 3/2017 | Mandegaran | H03K 5/125 |
| 2017/0126181 A1 * | 5/2017 | Embar | H03F 1/0288 |
| 2017/0230021 A1 * | 8/2017 | Goss | H03F 1/3247 |

FOREIGN PATENT DOCUMENTS

| | | |
|---|---|---|
| CN | 1808621 A | 7/2006 |
| CN | 1866544 A | 11/2006 |
| CN | 1866733 A | 11/2006 |
| CN | 101197558 A | 6/2008 |
| CN | 101589550 A | 11/2009 |
| CN | 101599300 A | 12/2009 |
| CN | 101937706 A | 1/2011 |
| CN | 102165686 A | 8/2011 |
| DE | 10063999 A1 | 8/2002 |
| EP | 0557929 A1 | 9/1993 |
| JP | S44-26805 | 11/1969 |
| JP | S44026805 | 11/1969 |
| JP | S59165509 A | 9/1984 |
| JP | H01318307 A | 12/1989 |
| JP | H05243880 A | 9/1993 |
| JP | H07321587 A | 12/1995 |
| JP | H10041774 | 2/1998 |
| JP | 2001185967 A | 7/2001 |
| JP | 2002252536 A | 9/2002 |
| JP | 2003133869 A | 5/2003 |
| JP | 2007129426 A | 5/2007 |

OTHER PUBLICATIONS

Notice of Allowance dated Sep. 30, 2016 for U.S. Appl. No. 14/500,992, 7 pages.

Non-Final Office Action dated Feb. 3, 2017 for U.S. Appl. No. 14/500,992, 8 pages.

Non-Final Office Action dated Apr. 18, 2016 for U.S. Appl. No. 14/500,992, 8 pages.

\* cited by examiner

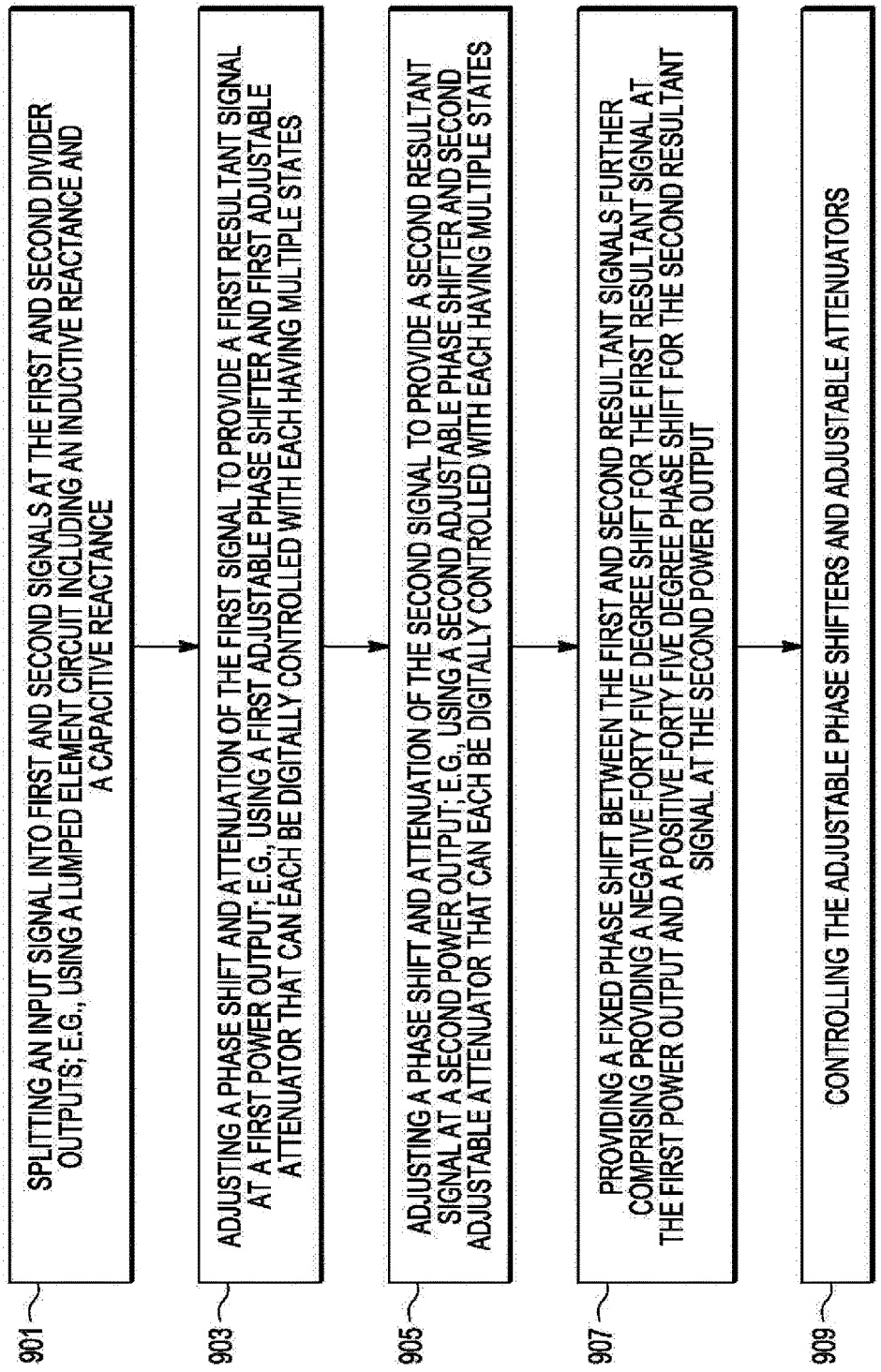

United States Patent

PHASE SHIFT AND ATTENUATION CIRCUITS FOR USE WITH MULTIPLE-PATH AMPLIFIERS

CROSS-REFERENCE TO RELATED APPLICATIONS

This application is a continuation of U.S. patent application Ser. No. 16/119,832, filed on Aug. 31, 2018, and to be issued on Feb. 19, 2019 as U.S. Pat. No. 10,211,787, which is a continuation of U.S. patent application Ser. No. 15/874, 740, filed on Jan. 18, 2018, and now issued as U.S. Pat. No. 10,069,463, which is a continuation of U.S. patent application Ser. No. 15/344,304, filed on Nov. 4, 2016, and now issued as U.S. Pat. No. 9,876,475, which is a continuation of U.S. patent application Ser. No. 15/184,910, filed on Jun. 16, 2016, and now issued as U.S. Pat. No. 9,490,755, which is a continuation of U.S. patent application Ser. No. 14/728, 196, filed on Jun. 2, 2015, and now issued as U.S. Pat. No. 9,374,051, which is a continuation of U.S. patent application Ser. No. 14/287,139, filed on May 26, 2014, and now issued as U.S. Pat. No. 9,219,453, which is a continuation of U.S. patent application Ser. No. 13/959,254, filed on Aug. 5, 2013, and now issued as U.S. Pat. No. 8,736,347, which is a continuation of U.S. patent application Ser. No. 13/360, 473, filed on Jan. 27, 2012, and now issued as U.S. Pat. No. 8,514,007.

FIELD OF THE INVENTION

This invention relates to power or signal splitters in general and more specifically to techniques and apparatus for adjustable power or signal splitting or dividing.

BACKGROUND OF THE INVENTION

Power splitters or signal splitters or dividers are known. They are used, as the name suggests, to divide or split a signal into two or more identical signals. Identical or nearly identical signals can be used in various systems where the same signal is processed in varying manners or the same manner with more than one resultant signal being used in some combination for some purpose. For example, if signals are subject to the same interferences or distortions a practitioner can start with identical signals and use differential processing and subtract the resultant signals to basically eliminate the common interferences. As another example, some amplifiers use or start with identical signals and process these signals in distinctly different manners and then combine the resultant signals in some fashion to provide the final amplified signal.

In many of these cases where identical signals are used to begin with, the relative phase of the resultant or resulting processed signals is critical for a successful combination. Practitioners have used a phase adjustment in one of the signal paths to attempt to address this problem.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 9 shows a flow chart of a method of adjusting a power split signal that may be used in conjunction with the FIG. 1 system in accordance with one or more embodiments.

DETAILED DESCRIPTION

In overview, the present disclosure concerns adjustable power splitters and methods therein and uses thereof, e.g., adjustable radio frequency power splitters, and more specifically techniques and apparatus for independently adjusting the signals at each output of the adjustable power splitter so the adjustable power splitter is or can be arranged and constructed for use with a Doherty power amplifier. More particularly various inventive concepts and principles embodied in methods and apparatus corresponding to adjustable power splitters suitable for use in amplifiers or Doherty amplifiers for improved efficiency, etc. will be discussed and disclosed.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Figure 1:
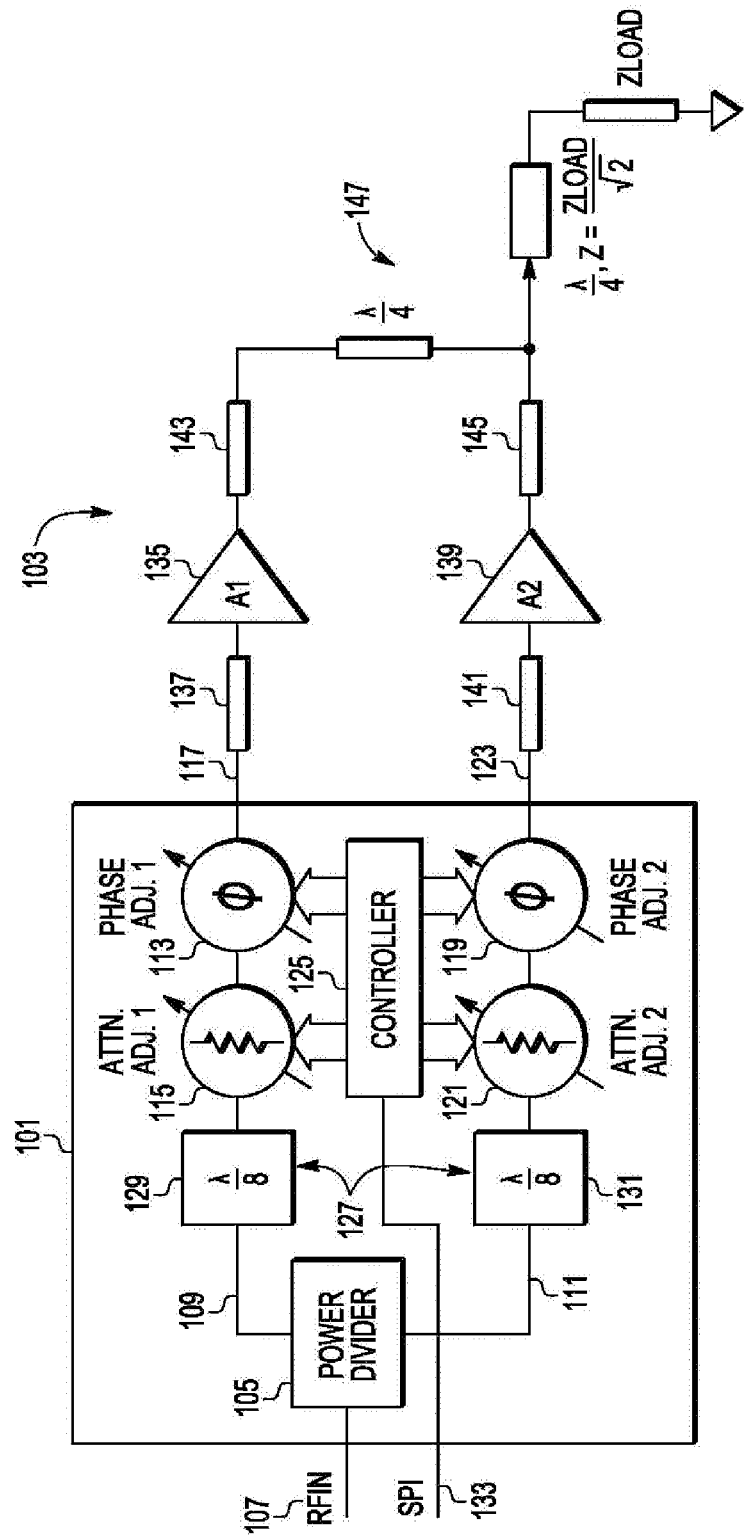
FIG. 1 depicts in a simplified and representative form an adjustable power splitter being used in a Doherty power amplifier system in accordance with one or more embodiments.

Referring to FIG. 1, a simplified and representative high level diagram of an adjustable power splitter utilized, e.g., in a Doherty power amplifier system in accordance with one or more embodiments will be briefly discussed and described. In FIG. 1 as shown, an adjustable power splitter 101 or radio frequency power splitter is coupled to or being utilized with or driving an amplifier, specifically a Doherty amplifier or Doherty power amplifier 103.

Figure 10:
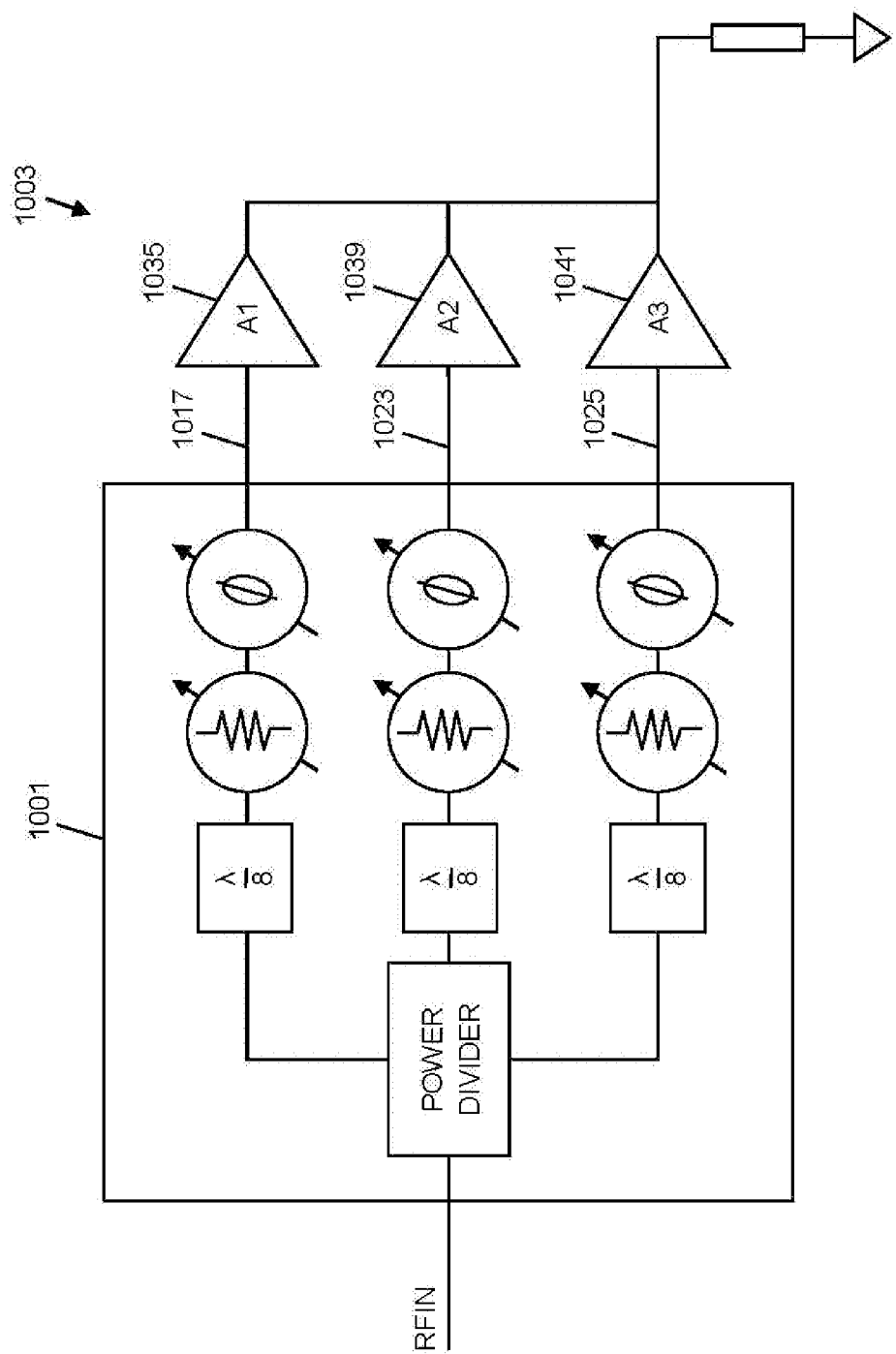
FIG. 10 depicts in a simplified and representative form an adjustable power splitter being used in a Doherty power amplifier system in accordance with one or more alternate embodiments.

The adjustable power splitter 101 includes a power divider 105 with an input 107 and a first and second divider output 109, 111. The power divider 105 operates to divide or split a signal at the input 107 into two (or more, as shown in FIG. 10) signals, which are identical or very nearly identical signals with in some embodiments equal power. This equal power form of power divider is often referred to as a 3 dB divider since the resultant signals are each 3 dB less than the signal at the input. While the 3 dB divider is typical, other dividers with multiple outputs or outputs with unequal signals could be fashioned and used in some applications. One or more embodiments of the power divider can be a lumped element circuit including an inductive and a capacitive reactance as will be further discussed below with reference to FIG. 2.

Further included in the adjustable radio frequency power splitter 101, as shown in FIG. 1, is a first adjustable phase shifter 113 and in some embodiments a first adjustable attenuator 115, which are series coupled to the first divider output 109 and configured for providing a first power output 117. It will be appreciated that the adjustable phase shifter and adjustable attenuator can be series coupled to each other in any order, i.e., attenuator followed by phase shifter as shown or vice versa. Further included in the adjustable radio frequency power splitter 101 is a second adjustable phase shifter 119 and in some embodiments a second adjustable attenuator 121, which are series coupled to the second divider output 111 and configured for providing a second power output 123. As noted above the order in which these are series coupled to each other can be changed.

In various embodiments of the adjustable power splitter 101, the first and typically the second adjustable phase shifter 113, 119 are each digitally controlled, e.g., by controller 125 and have a plurality of states. In one or more embodiments, the first adjustable phase shifter 113 and often the second adjustable phase shifter 119, each have eight phase shifted states. It will be appreciated that the first and second phase shifter may have different phase shifted states, cover different ranges, and have different steps sizes, although typically they will be essentially the same. While digitally controlled, the adjustable phase shifters in many embodiments are analog phase shifters. One or more embodiments of the adjustable phase shifters 113, 119 will be discussed below with reference to FIG. 4.

In various embodiments of the adjustable power splitter 101, the first and typically the second adjustable attenuator 115, 121 are each digitally controlled, e.g., by controller 125 and have a plurality of states. In one or more embodiments, the first adjustable attenuator 115 and often the second adjustable attenuator 121, each have eight attenuation states or attenuation levels. It will be appreciated that the first and second attenuation may have different attenuation states, cover different attenuation ranges, and have different attenuation steps sizes, although typically they will be essentially the same. While digitally controlled, the adjustable attenuators in many embodiments are analog attenuators. One or more embodiments of the adjustable attenuators 115, 121 will be discussed below with reference to FIG. 3.

Some embodiments of the adjustable power splitter 101 further include a fixed phase shifter 127 that is configured for adding a fixed phase shift between first and second signals at the, respective, first and second power outputs 117, 123. In some embodiments this can be a fixed and predetermined phase shift, e.g., 90 degrees, added to one signal path, i.e., path between output 109 and power output 117 or path between output 111 and power output 123. In certain applications, e.g., Doherty amplifier 103, a ninety degree phase shift is added to one path in the amplifier and the fixed phase shift can be used to offset this amplifier phase shift. The fixed phase shift in some embodiments is a phase shift in a direction (negative or positive), e.g., a negative shift λ/8 129, such as a negative forty five degree shift, for the first signal at the first power output 117 and a phase shift in the opposite direction, e.g., a positive shift λ/8 131 such as a positive forty five degree phase shift for the second signal at the second power output 123. Using the forty five degree shifts gives a ninety degree phase shift between the signals at the power outputs 117, 123. The phase shifter 127 or negative shift 129 and positive shift 131 can be lumped element circuits having an inductive and a capacitive reactance as will be further discussed below with reference to FIG. 2.

As suggested above, the adjustable power splitter 101 typically further comprises the controller 125 which is configured and arranged to control or for controlling the adjustable phase shifters and adjustable attenuators. The controller 125 can be provided data via an interface 133, such as a serial interface and in some embodiments this a serial peripheral interface (SPI), which as is known typically includes a data in and out, clock signal, and chip select lines. Various approaches and variants or combinations of those approaches can be utilized by the controller. Generally as will be explained below, control of the attenuators or phase shifters amounts to controlling switches, typically solid state or integrated switches such as some form of field effect transistor switch. Thus the controller can be provided state information for all switches in all attenuators and phase shifters and essentially act as one or more latching buffers with outputs arranged and coupled to ensure that all switches are in the appropriate ON or OFF state. Alternatively, the controller can be provided in essence an address or two or more addresses, which address(es) uniquely specify a state for each attenuator and phase shifter. For example if all phase shifters and attenuators are 8 state devices a 3 bit address for each would uniquely specify the proper state and 4 such addresses could be provided to the controller, which would convert each address to the appropriate control signals for each attenuator and phase shifter and latch in these values, etc. In other embodiments the amount of phase shift and attenuation for each of the four devices could be sent to the controller and it could determine the proper state to realize the desired shifts and attenuations. The practitioner is free to choose from among these or other approaches or combinations to make and retain the appropriate adjustments to the adjustable attenuators and adjustable phase shifters.

In addition to the adjustable power splitter 101, the radio frequency Doherty power amplifier 103 is shown where this amplifier includes a main amplifier 135 coupled via a matching network or circuit 137 to the first power output 117 and a peaking amplifier 139 coupled by its matching circuit 141 to the second power output 123. As will be appreciated by those of ordinary skill the main and peaking amplifiers are comprised of one or more stages of low level amplification and higher power level amplification. The main and peaking amplifiers are coupled via, respective, output matching circuits 143, 145 to a Doherty combiner 147, which as is configured such that the main amplifier provides the amplification for lower level signals and both amplifiers combine to provide the amplification for high level signals. This is usually accomplished by, e.g., biasing the main amplifier, such that is operates in a class AB mode and biasing the peaking amplifier such that it operates in a class C mode More complex embodiments are possible, such as is illustrated in FIG. 10, where an adjustable power splitter 1001 has three outputs 1017, 1023, 1025, and the Doherty amplifier 1003 has a main amplifier 1035 and two peaking amplifiers 1039, 1041 with each peaking amplifier biased in different class C operating points. In one or more of these manners, overall efficiency/linearity of the amplifier can be improved over a wider range of signal levels. Adjustments to the adjustable attenuators and adjustable phase shifters can be made in an experimental manner by monitoring power drawn by the peaking stage or main stage or both as a function of signal levels and the like. At certain signal levels the peaking amplifier should begin to operate and amplitude and phase adjustments can be made with this in mind.

FIG. 1 illustrates additional features for the adjustable power splitter with a Doherty amplifier where these features have been discussed above or will be discussed below in further detail. For example, the first and second adjustable phase shifters and the first and second adjustable attenuators are digitally controlled with each having multiple states, e.g., 8 or more or less states. The power divider can be a lumped element circuit including one or more inductive reactance and capacitive reactance and other elements. The lumped element circuit can further include a first lumped element phase shifter configured to provide a negative forty five degree phase shift for a first signal at the first power output and a second lumped element phase shifter configured to provide a positive forty five degree phase shift for a second signal at the second power output. As noted earlier the adjustable power splitter with Doherty amplifier can also include or comprise a controller for controlling the adjustable phase shifters and adjustable attenuators.

Figure 2:
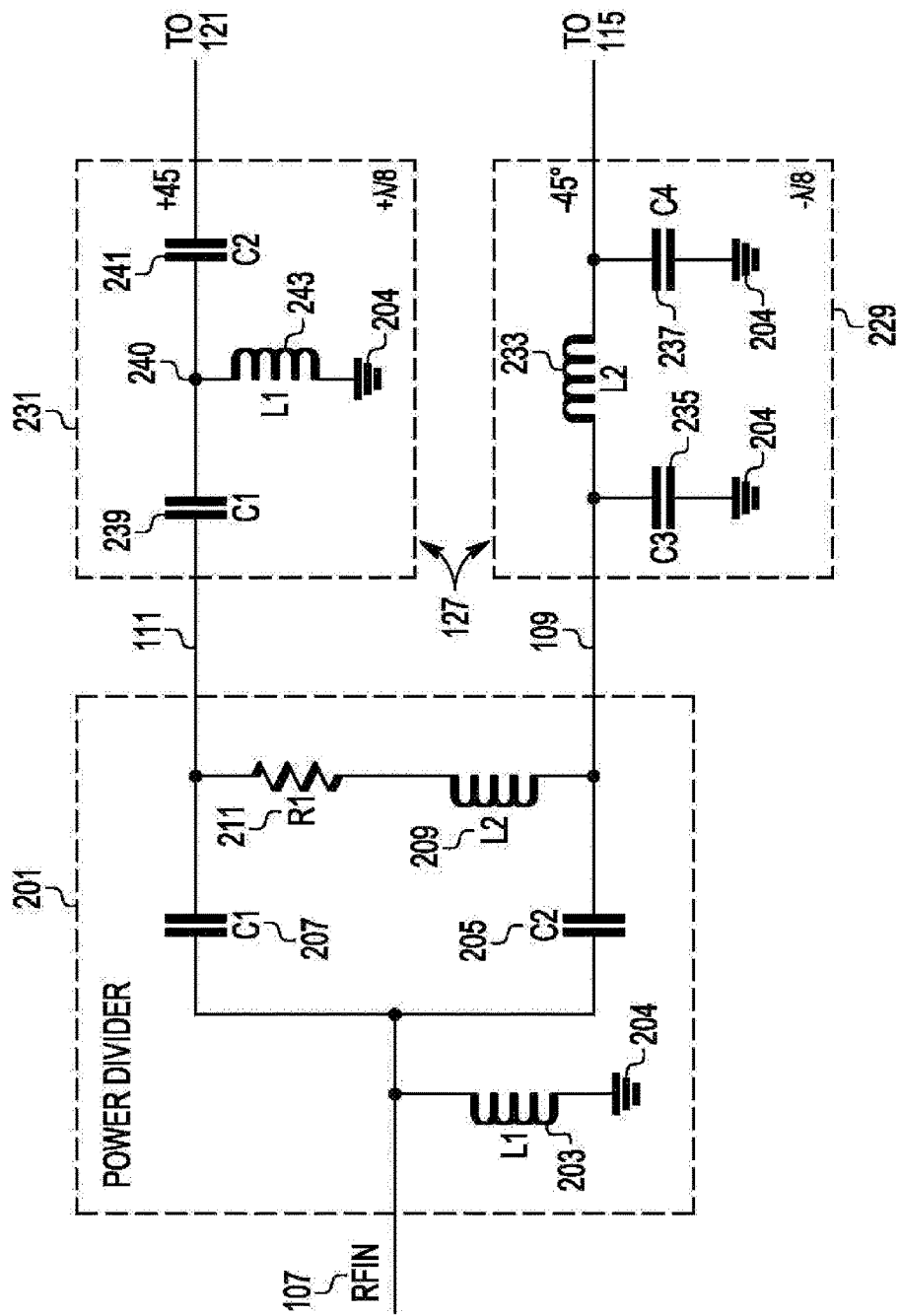
FIG. 2 in a representative form, shows a diagram of a power divider and fixed phase shifter in accordance with one or more embodiments, which is suitable for use in the FIG. 1 adjustable power splitter.

Referring to FIG. 2, a representative diagram of a power divider and fixed phase shifter(s) in accordance with one or more embodiments, which embodiments are suitable for use in the FIG. 1 adjustable power splitter, will be briefly discussed and described. In FIG. 2 and all ensuing FIGs. like reference numbers will designate like features from other FIGs. FIG. 2 illustrates an input or RF input 107 to a power divider 201 which has a first output or divider output 109 and a second output or divider output 111 (I/O numbered same as FIG. 1). The power divider as illustrated is implemented with one or more lumped element inductive reactances 203, 209 and one or more capacitive reactances 205, 207 as well as a resistive loss or resistor 211. As shown a shunt inductance 203 or inductor is coupled from the input to a reference node (ground) 204. This inductance will operate to reduce power in any low frequency signals at the input. Two series capacitances 205, 207 or capacitors 205, 207 are coupled from the input to, respectively, the first divider output 109 and the second divider output 111. These capacitances will typically be equal valued for a 3 dB splitter. A series coupled inductance 209 and resistance 211 is coupled between the first and second divider outputs and operates to balance the signal at these outputs. The actual values for the inductors and capacitors and resistor will vary in accordance with operating frequencies and operating impedances. Generally the shunt inductor 203 in combination with capacitor 207 forms a high pass structure which exhibits an impedance transformation between 107 (100 ohms for example) to 111 (50 ohms for example). Similarly, inductor 203 in combination with capacitor 205 forms a high pass structure which exhibits an impedance transformation between 107 (100 ohms for example) to 109 (50 ohms for example). Resistor 211 in combination with inductor 209 creates a 50 ohm (nominal) odd-mode impedance at nodes 111 and 109. The combination of the elements is such that nodes 107, 109, and 111 each exhibit an impedance of 50 ohms (for example) and he combination of elements can be further chosen such that and equal or unequal power is split from 107 to 111 and 107 to 109, respectively. One of ordinary skill can readily and experimentally determine the appropriate values for a given application. An alternative embodiment for the power splitter could use transmission lines although it is noted that these embodiments may not be as useful (e.g., much larger in physical size) over as broad of a bandwidth as the lumped element embodiments.

FIG. 2 also illustrates an embodiment of the fixed phase shifter in accordance with fixed phase shifter 127 and more specifically two fixed, but opposite direction phase shifters. One is a negative shift 229 such as a negative forty five degree shift that is coupled to divider output 109 and provides an output that goes to adjustable attenuator 115 (see FIG. 1). This negative shift 229 corresponds to negative shift 129 of FIG. 1. The negative shift 229 is a lumped element circuit having or implemented with an inductive reactance 233 coupled from divider output 109 to adjustable attenuator 115 and further having an input capacitive reactance 235 coupled from divider output 109 to a reference node (ground) 204 and an output capacitive reactance 237 or capacitor coupled from adjustable attenuator 115 input to the reference node 204. The specific values for the inductors and capacitors will depend on operating impedances and signal frequencies but can be experimentally determined by practitioners without undue experimentation.

The other fixed shift is a positive shift 231, such as a positive forty five degree shift that is coupled to divider output 111 and provides an output that goes to adjustable attenuator 121 (see FIG. 1). The positive shift 231 corresponds to the positive shift 131 of FIG. 1. The positive shift 231 is a lumped element circuit having an input capacitive reactance 239 coupled from divider output 111 to a common node 240 and an output capacitive reactance 241 or capacitor coupled from the common node 240 to adjustable attenuator 121 input. Further included is an inductive reactance 233 coupled from the common node 240 to the reference node (ground) 204. The specific values for the inductors and capacitors will depend on operating impedances and signal frequencies but can be experimentally determined by practitioners without undue experimentation.

Figure 3:
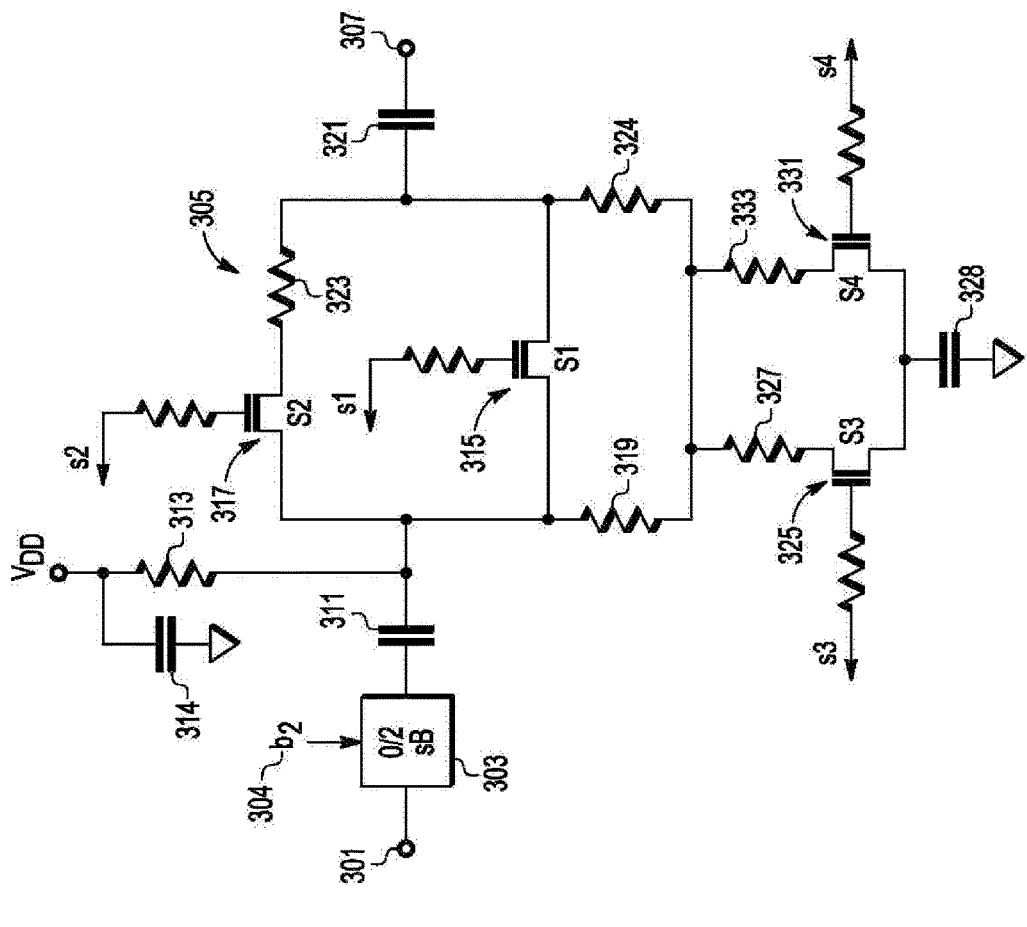
FIG. 3 depicts a representative diagram of an adjustable attenuator in accordance with one or more embodiments.

Referring to FIG. 3, a representative diagram of an adjustable attenuator in accordance with one or more embodiments will be discussed and described. FIG. 3 shows a representative embodiment of an adjustable attenuator suitable for use in the FIG. 1 adjustable power splitter. FIG. 3 illustrates an input 301 (analogous to input to adjustable attenuator 115 or 121 in FIG. 1) to a first variable attenuator 303, which provides either 0 db or 2 db of attenuation, where 2 dB is provided when b2 304 is high or equal to 1. The first variable attenuator is a resistive divider with a switch around the divider (not specifically shown). The control line b2 opens this switch. The first variable attenuator 303 is coupled to a second variable attenuator 305 which provides an attenuated signal at output 307 (analogous to input to 113, 119 in FIG. 1). The second variable attenuator is shown in more detail and is arranged and configured to provide 0 dB to 1.5 dB of attenuation in 0.5 dB steps, i.e., 0 dB, 0.5 dB, 1.0 dB, or 1.5 dB of attenuation where these steps or attenuations can be referred to as negative gains (e.g., −0.5 dB gain). Thus the serial combination of adjustable attenuator 303 and 307 can provide from 0 dB up to 3.5 dB of attenuation depending on control signal states, i.e., step through 0-1.5 dB with attenuator 305 and then bring in 2 dB with attenuator 303 and go through or repeat the steps, 0-3.5 dB, with attenuator 305.

Further shown in FIG. 3 is a table 309 of input signals b0, b1, and switch control signals s1-s4 which result from the input signals b0, b1 together with expected attenuation as a function of a particular combination of s1-s4. By observation s1 is the logical OR inverted (NOR) of b0, b1, i.e., high only when both inputs are low and low otherwise. Similarly s2 is the OR of b0, b1, i.e., high if either input is high. Further s3 is equal to b0 and s4 is the logical AND of b0, b1, i.e., high only if both inputs are high.

In more detail, the first adjustable attenuator 303 is coupled to a capacitance 311 which will have a near zero impedance for signals of interest and this capacitance is coupled to a resistor 313 which is a relatively high value and is used for biasing purposes. Supply noise is coupled to ground by capacitor 314. Capacitor 311 is further coupled to switch S1 315, switch S2 317, and resistor 319. When S1 is ON, (s1=1 or high) there will be near zero attenuation as the input signal at capacitor 311 will be coupled via S1 to the output capacitor 321 and thus output 307 since the output capacitor is near zero impedance for signals of interest (see also table, line 1). When S1 is OFF and S2 is ON (s1=0, s2=1 or high), the input signal at capacitor 311 will be coupled to resistor 323 and from there to the output capacitor 321. The input signal will also be coupled through the series combination of resistor 319 and 324 to the output capacitor 321. Resistors 323 in parallel with the series combination of resistors 319, 324 are chosen to provide an attenuation of 0.5 dB given the operating frequencies and impedances (see table, line 2). If, in addition to S2 being ON, switch S3 325 is ON (s3=1 or high), the signal at the node between resistors 319, 324 will be coupled via resistor 327 to capacitor 328 and thus ground. This will increase the attenuation and resistor 327 is selected such that an additional 0.5 dB or a total of 1.0 dB of attenuation is provided with this combination of switches (see table, line 3). If in addition to S2 and S3, switch S4 331 is ON (s4=1 or high) resistor 333 will be added in parallel with resistor 327 and the signal will be further attenuated. Resistor 333 is chosen to add a further 0.5 dB for a total of 1.5 dB of attenuation to the signal at the output (see table, line 4). Those of ordinary skill given a specific application with operating frequencies and impedances can determine the appropriate values of the resistors by calculation or experimentation.

Figure 4:
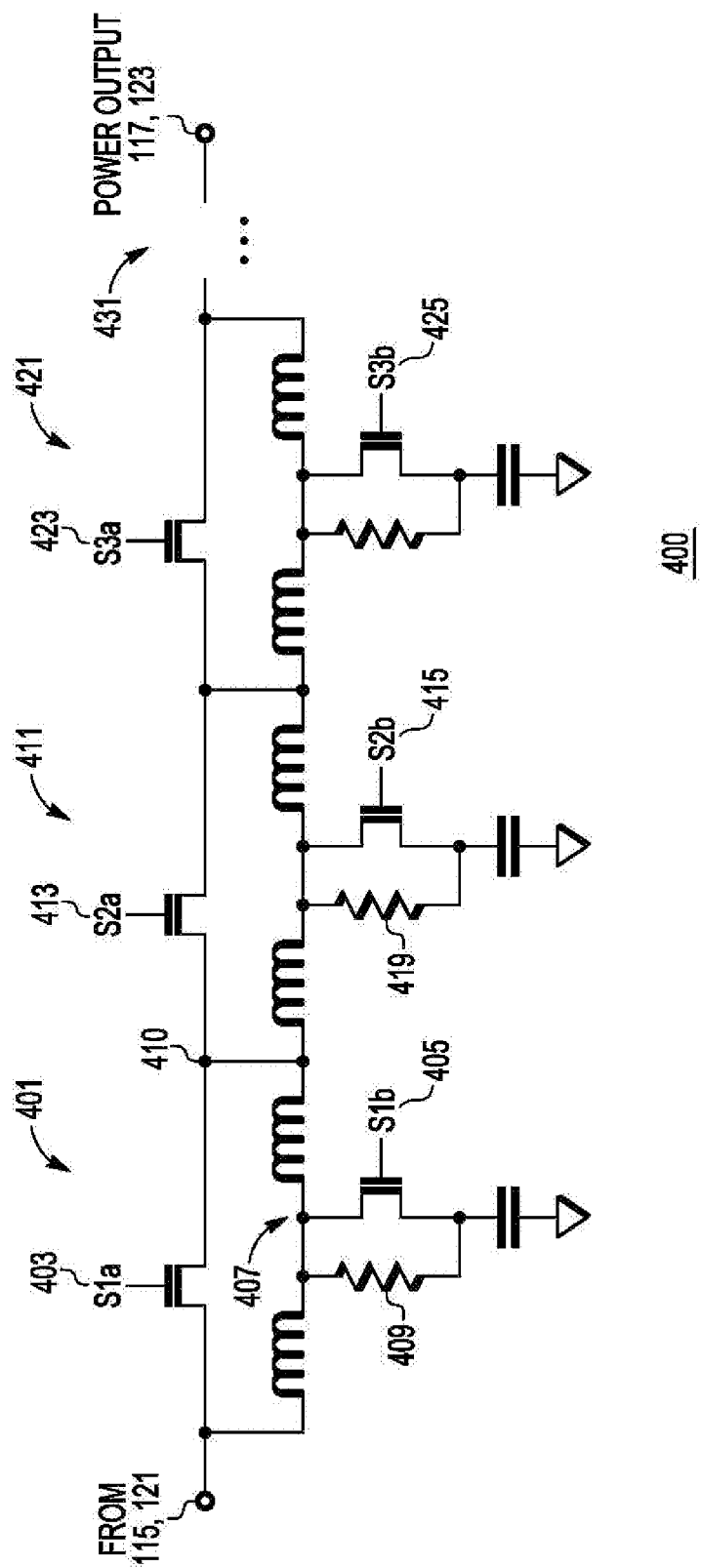
FIG. 4 depicts a representative diagram of an adjustable phase shifter in accordance with one or more embodiments.

Referring to FIG. 4, a representative diagram of an adjustable phase shifter in accordance with one or more embodiments will be discussed and described. The adjustable phase shifter illustrated in FIG. 4 is one embodiment of the subject matter of co-pending U.S. patent application Ser. No. 13/360,119, filed on Jan. 27, 2012, which application is hereby incorporated herein by reference.

FIG. 4 illustrates a high level diagram of a phase shifter or delay line phase shifter with selectable phase shift in accordance with one or more embodiments. In FIG. 4, an adjustable phase shifter 400 with selectable or variable phase shift is shown in a representative manner. The phase shifter 400 has an input coming from adjustable attenuator 115 or 121 in FIG. 1 or a signal input for input signals, e.g., radio frequency (RF) signals and an output coupled to divider or divider power outputs 117, 123 or a signal output for phase shifted versions of the input signal, e.g., phase shifted versions of the RF signals. Between the input and output are one or more switchable phase shifting elements or circuits, including specifically phase shifting elements 401, 411, 421, and possibly additional phase shifting elements or circuits 431 serially coupled as shown.

Generally speaking in many embodiments and as will be further discussed and described below, the switches shown are provided with a pair of single throw switches a, b for each phase shifting element 401, 411, 421. Each of the phase shifting elements can be designed, arranged and configured to provide some predetermined amount of phase shift. If a practitioner needs to cover a certain range of phase shift and needs a certain resolution for the phase shift it can be advantageous to design the first or one of the phase shifting elements to provide a choice between nominally zero or a minimal phase shift and the smallest phase shift step one needs (i.e., the resolution) with the next or another phase shifting element configured to provide minimal or 2× the smallest step needed. Thus with two phase shifting elements you can provide a near zero, 1×, 2×, and 3× small step in phase shift by activating different combinations of the a, b switches. Adding another phase shifting element with a 4× shift, allows 8 states with corresponding 0 to 7× the small step and so on. The number of phase shifting elements will be determined by the required resolution (step size) and the phase range needed to be covered (number of steps). For example if you want to cover 49 degrees with a resolution of 7 degrees then 8 states, including 0 will be required and this can be accomplished with 3 phase shifting elements etc. etc.

In more detail, switchable phase shifting element or circuit 401 (and the other similar phase shifting elements) further comprises a first signal path coupled between the input through a switch 403 or alternatively with switch 405 closed through phase shifting circuit 407 to an output 410. The first signal path, when activated by closing or activating switch 403 or integrated circuit switch, will be providing a near zero phase shift for a signal coupled through the first signal path. Further included is a second signal path coupled between the input and the output 410 via the phase shifting circuit 407 (switch 405 closed). The second path is configured for providing a second phase shift for a signal coupled through the second signal path. Basically switch 403 selects between the first path and the second path or between zero and some phase shift. Insertion loss is equalized between the first path and the second path by switching in (opening switch 405) a loss circuit, resistor 409, when the first signal path is selected. The switches 403, 405, 413, 415, 423, and 425, etc. are controlled by a control circuit, e.g., controller 125 or another controller or latch, which can alternatively be viewed as a portion of the phase shifter with selectable phase shift.

In these embodiments or other embodiments, when the switch or integrated circuit switch 403 is activated (closed or ON) thus selecting the first signal path, the resistive loss circuit or resistor 409 is switched in (switch 405 open or OFF) and is configured or value chosen to equalize the first insertion loss for the first path and the second insertion loss expected when the second signal path is selected (i.e., switch 403 is open and 405 is closed).

Various embodiments of the phase shifting circuit 407 as illustrated in FIG. 4 can further comprise a first reactance or inductor series coupled at a common node to a second reactance or inductor and a shunt circuit coupled from the common node to a reference node, e.g., a ground potential. The shunt circuit in varying embodiments further comprises a third reactance or capacitor in series with the resistive loss or resistor 409 where the switch or integrated circuit switch 405 is in parallel with the resistor 409. One embodiment uses lumped element inductors and a metal insulator metal capacitor as well as pseudo morphic high electron mobility transistors (pHEMT) for switches.

When the first switch or first integrated circuit switch 403 is closed, ON, or activated it selects the first signal path (provides a short circuit around the second signal path) and when the first switch 403 is open, OFF, or inactivated it deselects (opens) the first signal path and signal is routed via the second signal path and reactive phase shifting or changing circuit 407. When the first switch is closed 403 the second switch 405 will be open thereby adding the resistive loss circuit 409 to the reactive circuit 407. This additional loss when the first signal path is chosen can be selected, i.e., resistor value chosen, by experimental processes to equalize the insertion loss when the first signal path is selected with the insertion loss when the second signal path is selected, thereby removing any relationship between phase shift and insertion loss. Typically the resistive loss circuit or resistor will be several orders of magnitude larger than the ON resistance of an integrated circuit switch.

The first switch 403 or integrated circuit switch in series with the first signal path and the second switch 405 or integrated circuit switch for switching in the resistive loss circuit 409 are alternatively activated (when 403 is ON or CLOSED, 405 is OFF or OPEN and vice-a-versa). Similarly the phase shifting element or circuit 411 which can comprise a third switch S2a 413 or integrated circuit switch in series with the third signal path and a fourth switch S2b 415 or integrated circuit switch for the switching in a second resistive loss circuit 419, wherein the third and fourth switch or integrated circuit switch are alternatively activated (when one closed other open). In some embodiments, the first (and second) resistive loss circuit is a resistor in parallel with the second (and fourth) integrated circuit switch and the first (and second) resistive loss circuit is switched in by opening the second (and fourth) integrated circuit switch, thereby equalizing the first and second (and third and forth) insertion loss.

The control circuit is arranged to control first, second, third and fourth switches. As suggested above in some embodiments the control circuit is configured to select at least one state from available states of minimal phase shift, a first phase shift, a second phase shift, and a first plus second phase shift by activating one or more of the first, thus second, and third, thus fourth, integrated circuit switches. To select the states in order (near zero phase shift through first plus second phase shift), switches 403, 413 are ON for near zero, switches 405, 413 are ON for a first shift, switches 403, 415 are ON for a second phase shift, and switches 413, 415 are ON for a first plus second phase shift. In the above, it is understood that undesignated or unspecified switches are OFF. As suggested above, each time another switchable phase shifting element or circuit is added, e.g., 421 with switches 423, 425) the number of possible states can double and the range of phase shift for a given step size can therefore double or alternatively for a given range the resolution can double, i.e., step size can be cut in half.

The controller 125 or control circuit in addition to possibly selecting timing for activating switches and decoding inputs can, for many embodiments, by viewed as a register or buffer for storing switch state (ON or OFF) information with one output coupled to each of the switches. The control circuit can be programmed or loaded via inputs 133. These inputs may simply specify a state for the phase shifter which is then decoded by the control circuit into switch states or the inputs can be the state for each switch or specify how much phase shift is desired with the control circuit then determining an appropriate state. The inputs can be sent to the control circuit via the serial peripheral interface (SPI). This is a generally known serial interface as indicated above.

Figure 6:
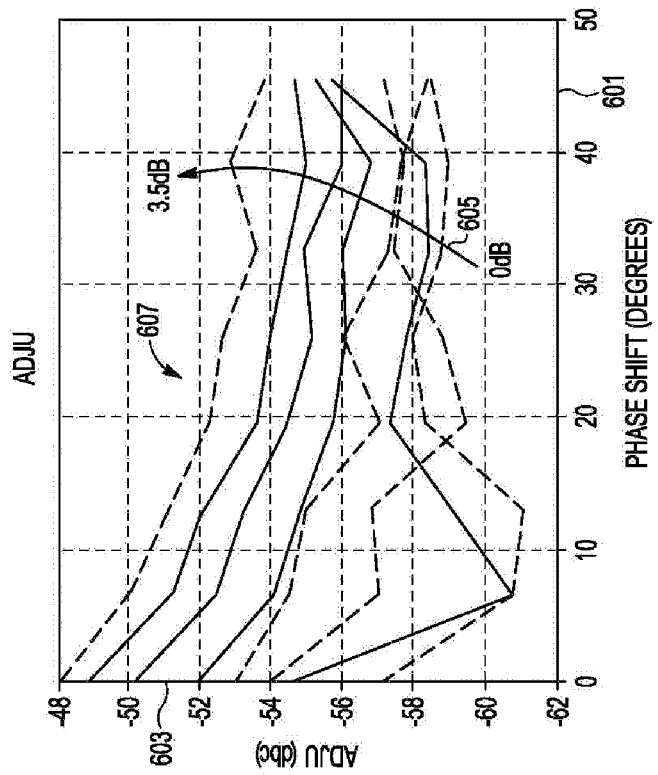
FIGS. 5-8 show various performance data of one or more embodiments.
Figure 5:
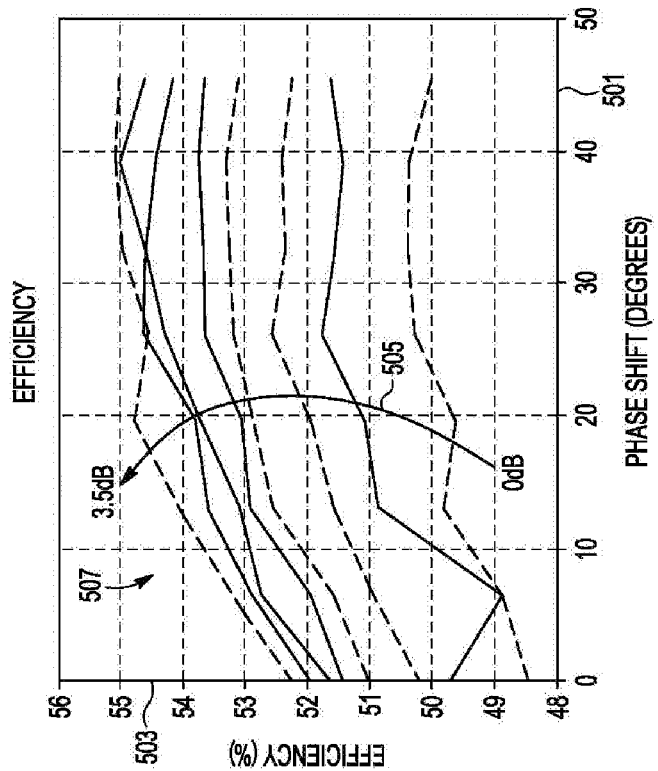

Referring to FIGS. 5-8 various experimental data showing assorted performance of one or more embodiments will be discussed and described. FIG. 5-6 show efficiency and linearity as a function of phase for various attenuator settings where the data was gathered at a power output of 47 dBm from one amplifier and one set of amplifier transistors using an adjustable power splitter. FIG. 5 specifically shows phase adjustment from zero degrees to approximately 45 degrees on the horizontal axis 501 and plots efficiency percentage on the vertical axis 503 as a function of the phase variation for 8 different attenuator settings 505. These 8 settings are represented by 8 line graphs 507 which is one graph for each 0.5 dB increment in attenuator setting. As one example, at approximately 40 degrees the second line from the top, i.e., with 3 dB of attenuation, shows approximately 55% efficiency. FIG. 6 shows linearity as a function of phase adjustment or shift. The phase shift is shown on the horizontal axis 601 with linearity (adjacent channel power ratio—upper side in dB relative to the carrier) on the vertical graph 603 for 8 different attenuator settings 605. These 8 settings are represented by 8 line graphs 607 which is one graph for each 0.5 dB increment in attenuator setting. As one example, at approximately 40 degrees the second line from the top, i.e., with 3 dB of attenuation, shows approximately 55 dBc linearity. Generally, the way to use this data is select the attenuation and phase shift that provides acceptable linearity (55 dBc) and the best efficiency—in this instance approximately 55%

Figures 7, 8:
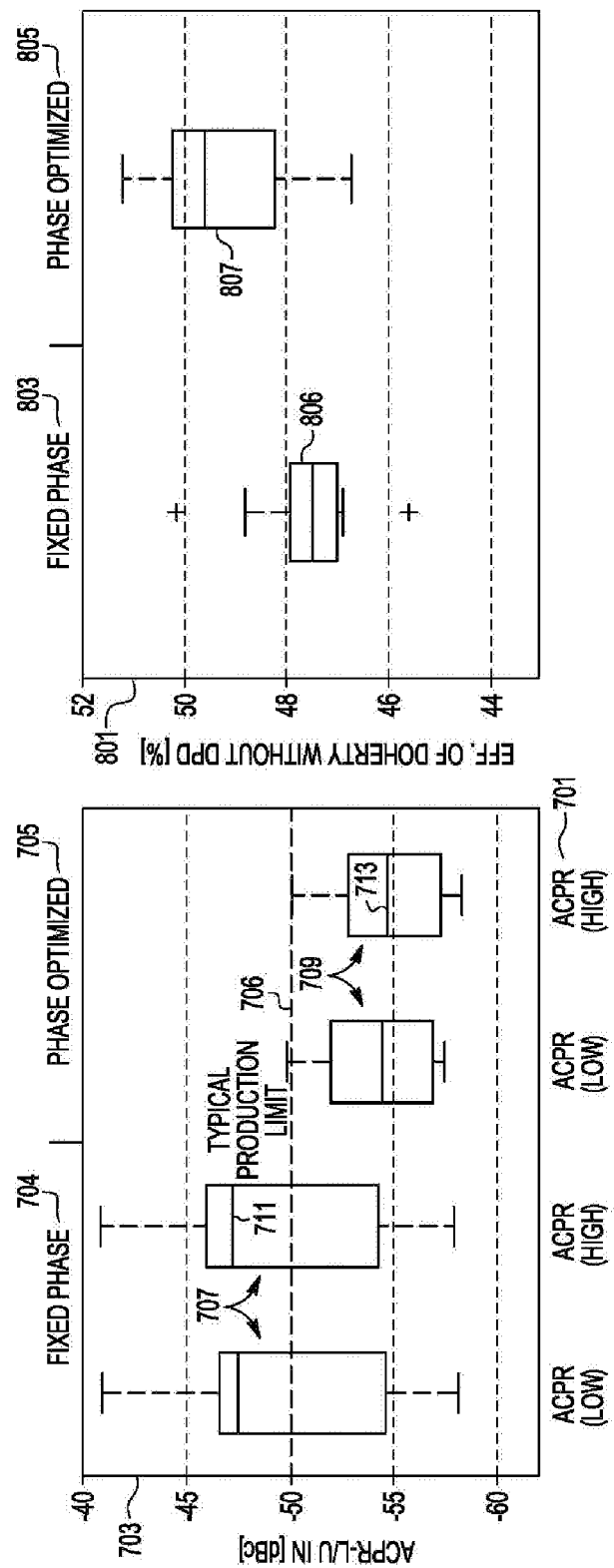

FIGS. 7-8 show amplifier performance for 20 random combinations of transistors, where these transistors were selected from non average lots. The random combinations are each inserted into an amplifier fixture and measurements are taken with output power at 47 dBm. FIG. 7 specifically shows adjacent channel power ratio on the low and high side of the carrier 701 with the measured results shown on the vertical axis 703. Measurements are taken for fixed or nominal phase setting 704 and for an optimized phase setting 705. A typical production specification or limit 706 is shown. All of the measurements for all of the combinations under each condition are shown in boxes with fixed phase conditions for lower and higher side shown in boxes 707 and optimized phase conditions for lower and higher side shown in boxes 709. By observation many of the combinations were failing the production limit 706 with a fixed or nominal phase setting while all combinations were better than the limits with optimized phase settings. Furthermore, the median measurement 711 in the fixed phase case was well above the limit and toward one end of the box, whereas the median measurement 713 for the optimized phase case is well within the production limits and much closer to the center of the box. FIG. 8 shows measured % efficiencies on the vertical axis 801 for the random combinations in a Doherty amplifier using digital pre distortion (DPD) for fixed or nominal phase setting 803 and optimized phase settings 805 with measured efficiencies shown in, respective, boxes 806, 807. By observation % efficiencies have improved by 1 to 3% with an average improvement of approximately 2%.

Referring to FIG. 9, a flow chart of exemplary processes included in a method of adjusting a power split signal or power splitter that can be used in conjunction with the FIG. 1 system in accordance with one or more embodiments will be discussed and described. It will be appreciated that this method uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures. It will be appreciated that the method can be performed as many times as desired or continually performed as needed The method of adjusting a power split signal or power splitter illustrated in FIG. 9 includes splitting 901 an input signal into first and second signals at first and second divider outputs. This can include using a lumped element circuit including an inductive reactance and a capacitive reactance. This may also necessitate providing a power divider or splitter with an input and a first and second divider output where the power divider is configured to split an input signal into first and second signals at the first and second divider outputs. The providing can include providing a lumped element circuit including an inductive reactance and a capacitive reactance.

Also included in the method of FIG. 9 is adjusting 903 a phase shift and attenuation of the first signal to provide a first resultant signal at a first power output; which can include, e.g., using a first adjustable phase shifter and first adjustable attenuator that are each digitally controlled with each having multiple states. In some embodiments this may include disposing a first adjustable phase shifter and first adjustable attenuator series coupled to the first divider output and arranged and configured to phase shift and attenuate the first signal and provide a first resultant signal at a first power output. These can each be digitally controlled with each having multiple states, e.g., 8 states.

Next shown is adjusting 905 a phase shift and attenuation of the second signal to provide a second resultant signal at a second power output; which can include, e.g., using a second adjustable phase shifter and second adjustable attenuator that are each digitally controlled with each having multiple states. This can be accomplished in some instances by disposing a second adjustable phase shifter and second adjustable attenuator series coupled to the second divider output and arranged and configured to phase shift and attenuate the second signal and provide a second resultant signal at a second power output. Again, these can each be digitally controlled with each having multiple states.

In some embodiments, the method includes providing 907 a fixed phase shift between the first and second resultant signals, which can further comprise, e.g., providing a negative forty five degree shift for the first resultant signal at the first power output and a positive forty five degree phase shift for the second resultant signal at the second power output. Again disposing a fixed phase shifter arranged and configured to provide a fixed phase shift between signals at the first and second power output, e.g., to provide a negative forty five degree shift for the first resultant signal at the first power output and a positive forty five degree phase shift for the second resultant signal at the second power output. In most embodiments, the method includes controlling 909 the adjustable phase shifters and adjustable attenuators.

It will be appreciated that the above described functions and adjustable signal or power splitters may be implemented with one or more integrated circuits or hybrid structures or combinations or the like. The processes, apparatus, and systems, discussed above, and the inventive principles thereof are intended to and can alleviate yield and performance issues caused by prior art techniques. Using these principles of independent adjustment of phase or signal level or signal attenuation within a power splitter can quickly resolve performance and production yield problems in, e.g., Doherty amplifiers with relatively minor costs and the like.

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An adjustable power splitter circuit comprising:
   a radio frequency (RF) input;
   first and second power outputs;
   a divider circuit configured to power divide a first RF signal received at the RF input into second and third RF signals, wherein the divider circuit is further configured to produce the second and third RF signals with a predetermined phase shift between the second and third RF signals;
   a first signal adjustment circuit coupled to the divider circuit to receive the second RF signal, wherein the first signal adjustment circuit comprises a first adjustable phase shifter circuit and a first attenuator circuit coupled in series, wherein the first attenuator circuit is a first variable attenuator circuit, wherein the first signal adjustment circuit receives the second RF signal from the divider circuit, the first adjustable phase shifter circuit applies a first phase shift to the second RF signal, and the first attenuator circuit applies a first attenuation to the second RF signal to produce a fourth RF signal at the first power output;
   a second signal adjustment circuit coupled to the divider circuit to receive the third RF signal, wherein the second signal adjustment circuit is coupled to the divider circuit in parallel with the first signal adjustment circuit, wherein the second signal adjustment circuit comprises a second adjustable phase shifter circuit and a second attenuator circuit coupled in series, wherein the second signal adjustment circuit receives the third RF signal from the divider circuit, the second adjustable phase shifter circuit applies a second phase shift to the third RF signal, and the second attenuator circuit applies a second attenuation to the third RF signal to produce a fifth RF signal at the second power output; and
   a serial data interface, wherein the adjustable power splitter circuit is configured to receive data indicating the first phase shift, the second phase shift, and the first attenuation through the serial data interface, and the adjustable power splitter circuit is further configured to control, based on the data, application of the first phase shift by the first signal adjustment circuit, application of the second phase shift by the second signal adjustment circuit, and application of the first attenuation by the first signal adjustment circuit.

2. The circuit of claim 1, wherein:
the first adjustable phase shifter circuit and the first attenuator circuit are separate circuits; and
the second adjustable phase shifter circuit and the second attenuator circuit are separate circuits.

3. The circuit of claim 1, wherein the first variable attenuator circuit provides a range of attenuation in 0.5 decibel (dB) steps.

4. The circuit of claim 1, wherein:
the second attenuator circuit is a second variable attenuator circuit; and
the data interface is configured to receive second data indicating the second attenuation, and the adjustable power splitter circuit is further configured to control, based on the second data, application of the second attenuation by the second variable attenuator circuit.

5. The circuit of claim 4, wherein the first and second attenuator circuits have same attenuation states, cover a same attenuation range, and have same attenuation steps sizes.

6. The circuit of claim 4, wherein the first and second attenuator circuits have different attenuation states, cover different attenuation ranges, and have different attenuation steps sizes.

7. The circuit of claim 1, wherein the predetermined phase shift is a ninety degree phase shift.

8. The circuit of claim 1, wherein the serial data interface includes a data in line and a clock signal line.

9. The circuit of claim 1, wherein the first adjustable phase shifter circuit comprises a plurality of switchable, serially coupled phase shifting elements.

10. The circuit of claim 1, wherein the first variable attenuator circuit comprises a resistive divider.

11. The circuit of claim 1, wherein the serial data interface is selected from a serial interface and a serial peripheral interface.

12. The circuit of claim 1, wherein the data includes a multiple-bit value that uniquely specifies one of multiple phase shifted states for the first adjustable phase shifter circuit, one of multiple phase shifted states for the second adjustable phase shifter circuit, and one of multiple attenuation states for the first variable attenuator circuit.

13. A Doherty power amplifier comprising:
a radio frequency (RF) input;
first and second parallel amplifier paths selected from a main amplifier path and a peaking amplifier path;
a divider circuit configured to power divide a first RF signal received at the RF input into second and third RF signals for the main and peaking amplifier paths, wherein the divider circuit is further configured to produce the second and third RF signals with a ninety degree phase shift between the second and third RF signals;
a first signal adjustment circuit coupled to the divider circuit to receive the second RF signal, wherein the first signal adjustment circuit comprises a first adjustable phase shifter circuit and a first attenuator circuit coupled in series, wherein the first attenuator circuit is a first variable attenuator circuit, wherein the first signal adjustment circuit receives the second RF signal from the divider circuit, the first adjustable phase shifter circuit applies a first phase shift to the second RF signal, and the first attenuator circuit applies a first attenuation to the second RF signal to produce a fourth RF signal at a first power output;
a second signal adjustment circuit coupled to the divider circuit to receive the third RF signal, wherein the second signal adjustment circuit is coupled to the divider circuit in parallel with the first signal adjustment circuit, wherein the second signal adjustment circuit comprises a second adjustable phase shifter circuit and a second attenuator circuit coupled in series, wherein the second signal adjustment circuit receives the third RF signal from the divider circuit, the second adjustable phase shifter circuit applies a second phase shift to the third RF signal, and the second attenuator circuit applies a second attenuation to the third RF signal to produce a fifth RF signal at a second power output; and
a data interface, wherein the Doherty power amplifier is configured to receive data indicating the first phase shift, the second phase shift, and the first attenuation through the data interface, and the Doherty power amplifier is further configured to control, based on the data, application of the first phase shift by the first signal adjustment circuit, application of the second phase shift by the second signal adjustment circuit, and application of the first attenuation by the first signal adjustment circuit.

14. The amplifier of claim 13, wherein:
the first adjustable phase shifter circuit and the first attenuator circuit are separate circuits; and
the second adjustable phase shifter circuit and the second attenuator circuit are separate circuits.

15. The amplifier of claim 13, wherein:
the second attenuator circuit is a second variable attenuator circuit; and
the data interface is configured to receive data indicating the second attenuation, and the adjustable power splitter circuit is further configured to control, based on the second data, application of the second attenuation by the second variable attenuator circuit.

16. The amplifier of claim 13, wherein the data includes a multiple-bit value that uniquely specifies one of multiple phase shifted states for the first adjustable phase shifter circuit, one of multiple phase shifted states for the second adjustable phase shifter circuit, and one of multiple attenuation states for the first variable attenuator circuit.

17. The amplifier of claim 13, further comprising:
a first amplifier coupled to the first power output of the first signal adjustment circuit, wherein the first amplifier is configured to receive and amplify the fourth RF signal to produce a sixth RF signal;
a second amplifier coupled to the second power output of the second signal adjustment circuit, wherein the second amplifier is configured to receive and amplify the fourth RF signal to produce a seventh RF signal; and
a combiner coupled to the first and second amplifiers and configured to receive and combine the sixth and seventh RF signals to produce an eighth RF signal.

18. The amplifier of claim 13, wherein the data interface is selected from a serial interface and a serial peripheral interface.

19. The amplifier of claim 13, wherein:
the first signal adjustment circuit is coupled between the divider circuit and the main amplifier path; and
the second signal adjustment circuit is coupled between the divider circuit and the peaking amplifier path.

20. The amplifier of claim 13, wherein:
the first signal adjustment circuit is coupled between the divider circuit and the peaking amplifier path; and
the second signal adjustment circuit is coupled between the divider circuit and the main amplifier path.

\* \* \* \* \*